United States Patent
Krueger

(10) Patent No.: US 7,719,270 B2
(45) Date of Patent: May 18, 2010

(54) METHOD AND APPARATUS FOR ACCELERATED SPIRAL-CODED IMAGING IN MAGNETIC RESONANCE TOMOGRAPHY

(75) Inventor: Gunnar Krueger, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 341 days.

(21) Appl. No.: 11/776,617

(22) Filed: Jul. 12, 2007

(65) Prior Publication Data
US 2008/0021303 A1    Jan. 24, 2008

(30) Foreign Application Priority Data
Jul. 12, 2006    (DE) ................ 10 2006 032 339

(51) Int. Cl.
G01V 3/00    (2006.01)
(52) U.S. Cl. .................. 324/307; 324/309; 324/318
(58) Field of Classification Search ......... 324/300–318; 600/407–435
See application file for complete search history.

(56) References Cited

U.S. PATENT DOCUMENTS

| | | | | |
|---|---|---|---|---|
| 4,307,343 A | | 12/1981 | Likes ........................ | 324/307 |
| 4,912,413 A | | 3/1990 | DeMeester et al. ........ | 324/312 |
| 5,122,747 A | * | 6/1992 | Riederer et al. ........... | 324/309 |
| 5,270,653 A | * | 12/1993 | Pauly ....................... | 324/309 |
| 5,402,067 A | * | 3/1995 | Pauly et al. .............. | 324/307 |
| 5,485,086 A | * | 1/1996 | Meyer et al. .............. | 324/307 |
| 5,539,313 A | * | 7/1996 | Meyer ...................... | 324/309 |
| 5,604,434 A | | 2/1997 | Schomberg ................ | 324/309 |
| 5,604,435 A | * | 2/1997 | Foo et al. ................. | 324/309 |
| 5,650,723 A | * | 7/1997 | Meyer ...................... | 324/309 |
| 5,651,047 A | * | 7/1997 | Moorman et al. .......... | 378/98.8 |
| 5,652,516 A | * | 7/1997 | Adalsteinsson et al. ..... | 324/309 |
| 5,810,726 A | * | 9/1998 | Van Vaals et al. .......... | 600/410 |
| 6,020,739 A | * | 2/2000 | Meyer et al. .............. | 324/309 |
| 6,400,152 B1 | * | 6/2002 | Cline et al. ................ | 324/309 |
| 6,411,089 B1 | * | 6/2002 | Anand et al. .............. | 324/309 |
| 6,486,670 B2 | * | 11/2002 | Heid ........................ | 324/307 |
| 6,995,560 B2 | * | 2/2006 | Duerk et al. ............... | 324/310 |
| 7,042,215 B2 | * | 5/2006 | Moriguchi et al. ......... | 324/307 |
| 7,132,827 B2 | * | 11/2006 | Griswold et al. ........... | 324/309 |
| 7,245,125 B2 | * | 7/2007 | Harer et al. ................ | 324/310 |
| 7,265,545 B2 | * | 9/2007 | Kruger et al. .............. | 324/309 |
| 7,348,776 B1 | * | 3/2008 | Aksoy et al. ............... | 324/307 |
| 2002/0002331 A1 | * | 1/2002 | Cline et al. ................ | 600/410 |
| 2005/0073303 A1 | * | 4/2005 | Harer et al. ................ | 324/307 |
| 2005/0264287 A1 | * | 12/2005 | Griswold et al. ........... | 324/309 |
| 2006/0022673 A1 | | 2/2006 | Macovski .................. | 324/307 |
| 2007/0110290 A1 | * | 5/2007 | Chang et al. .............. | 600/410 |
| 2008/0021303 A1 | * | 1/2008 | Krueger .................... | 600/410 |
| 2008/0054899 A1 | * | 3/2008 | Aksoy et al. ............... | 324/307 |
| 2009/0177071 A1 | * | 7/2009 | Harley et al. .............. | 600/374 |

* cited by examiner

Primary Examiner—Brij B. Shrivastav
Assistant Examiner—Tiffany A Fetzner
(74) Attorney, Agent, or Firm—Schiff Hardin LLP

(57) ABSTRACT

In a method and apparatus for accelerated spiral-coded imaging in magnetic resonance tomography using spiral-shaped k-space sampling, the underlying k-matrix is under-sampled such that an additional spiral is obtained by point mirroring of the measured values at the center of the k-matrix. This additional spiral forms a complete data set of the k-matrix together with the first spiral for imaging the output information.

4 Claims, 3 Drawing Sheets

METHOD AND APPARATUS FOR ACCELERATED SPIRAL-CODED IMAGING IN MAGNETIC RESONANCE TOMOGRAPHY

BACKGROUND OF THE INVENTION

1. Field of the Invention

The present invention in general concerns magnetic resonance tomography (MRT) as used in medicine for examination of patients. The present invention is particularly concerned with a spiral-coded method for accelerated MRT imaging as well as a magnetic resonance tomography apparatus which is suitable for implementation of such a method.

2. Description of the Prior Art

MRT is based on the physical phenomenon of magnetic resonance and has been successfully used as an imaging method for over 15 years in medicine and biophysics. In this examination modality the subject is exposed to a strong, constant magnetic field. The spins of the atoms in the subject, which were previously randomly oriented, thereby align. Radio-frequency energy can now excite these "ordered" spins to a specific oscillation. In MRT, this oscillation generates the actual measurement signal which is acquired by suitable reception coils. By the use of non-homogeneous magnetic fields generated by gradient coils, the measurement subject can be spatially coded in all three spatial directions. The method allows a free selection of the slice to be imaged, so slice images of the human body can be acquired in all directions. MRT as a slice image modality in medical diagnostics is distinguished predominantly as a "non-invasive" examination method via a versatile contrast possibility. Due to the excellent representation capability of the soft tissue, MRT has developed into a method superior in many ways to x-ray computed tomography (CT). MRT today is based on the application of spin echo and gradient echo sequences that enable an excellent image quality with measurement times on the order of minutes.

The continuous technical development of the components of MRT apparatuses and the introduction of faster imaging sequences has opened more fields of use for MRT in medicine. Real-time imaging for supporting minimally-invasive surgery, functional imaging in neurology and perfusion measurement in cardiology are only a few examples. In spite of the technical advances in the design of MRT apparatuses, the acquisition time of an MRT image remains the limiting factor for many applications of MRT in medical diagnostics. From a technical viewpoint (feasibility) and for reasons of patient protection (stimulation and tissue heating), a limit is set on a further increase of the performance of MRT apparatuses with regard to the acquisition time. In recent years various efforts have been made to further reduce the image measurement time by different approaches.

One approach to shorten the acquisition time is to reduce the quantity of the image data to be acquired. In order to obtain a complete image from such a reduced data set, either the missing data must be reconstructed with suitable algorithms or the incorrect image from the reduced data must be corrected.

The acquisition of the data in MRT occurs in what is known as k-space (frequency domain). The MRT image in what is known as the image domain is linked with the MRT data in k-space by Fourier transformation. The spatial coding of the subject, which spans k-space occurs by means of gradients in all three spatial directions. Differentiation is made between the slice selection gradient (establishes an acquisition slice in the subject, typically the z-axis), the frequency coding gradient (establishes a direction in the slice, typically the x-axis) and the phase coding gradient (determines the second dimension within the slice, typically the y-axis).

Depending on the combination or interleaving of the three gradients in the imaging sequence, the sampling of k-space can ensue in a Cartesian manner (thus line-by-line) or radially or in a spiral trajectory (path).

Spiral-shaped sampling of k-space, which represents a very efficient method, is exclusively considered in the context of the present invention. Spiral-shaped k-space trajectories were first proposed by Likes as possible alternatives to Cartesian sampling (U.S. Pat. No. 4,307,343). It was thereby shown that, in contrast to, for example, a Cartesian sampling, a spiral-shaped readout of the k-matrix leads to a more isotropic RF pulse response signal. In particular, the use of fast spiral sampling (fast spiral imaging) as an equivalent to echoplanar imaging (EPI) therefore increasingly gained in popularity, particularly in the fields of functional MRT, perfusion MRT, MR spectroscopy, diffusion MRT and phase contrast-based MRT flow measurements.

Image quality reductions due to frequency and phase errors during the readout times of the RF response signal are a previously unsolved problem in fast MRT imaging in general (fast single shot spiral scanning or fast multi shot spiral scanning and EPI). These reductions are manifested in EPI in the form of image distortions in the reconstructed image.

In fast spiral MRT imaging, the reconstructed image is locally fuzzy and blurred due to regionally-limited frequency shifts in k-space. In spiral imaging these errors are generally designated as "blurring" (in contrast to distortion, for example in Cartesian EPI sequences). The causes for these errors are primarily susceptibility limits and inhomogeneities in the tissue of the subject to be examined, such causes and therefore the errors are generally more strongly pronounced at higher field strengths.

The problem of "blurring" can be distinctly minimized when the readout time is shortened since relevant phase errors cannot develop as quickly or as strongly. Conventionally, this is achieved by reducing the number of the revolutions of the scanning path while retaining the size of the sampled region. There are approaches to utilize the parallel imaging technique (PPA technique) in spiral coding to shorten the readout duration. However, such a method is extremely computation-time-intensive and therefore is not practically applicable at the present point in time.

SUMMARY OF THE INVENTION

An object of the present invention is to shorten the readout duration of a spiral-shaped acquisition method significantly without otherwise accepting disadvantages.

This object is achieved according to the invention by a method for spiral-shaped k-space sampling in magnetic resonance tomography, wherein the k-matrix is under-sampled such that an additional spiral is acquired by point mirroring of the measured values at the center of the k-matrix, the additional spiral forming a complete data set of the k-matrix together with the first spiral for imaging the output information.

In order to avoid phase variation over the entire image, it can be advantageous to implement the sampling in the region of the center of the k-matrix with full or, respectively, excessive density.

According to the invention, the phase corrections are implemented with, for example, Margosian and/or Pocs algorithms.

The above object also is achieved in accordance with the present invention by a magnetic resonance tomography apparatus that is operable to implement the method described above, together with all of the described embodiments.

The above object also is achieved in accordance with the present invention by a computer software product (i.e., a computer-readable medium encoded with a data structure) that is loadable into a control computer of a magnetic resonance tomography apparatus in order to cause the magnetic resonance apparatus to implement the method as described above, including all embodiments thereof.

DESCRIPTION OF THE PREFERRED EMBODIMENTS

Figure 1:
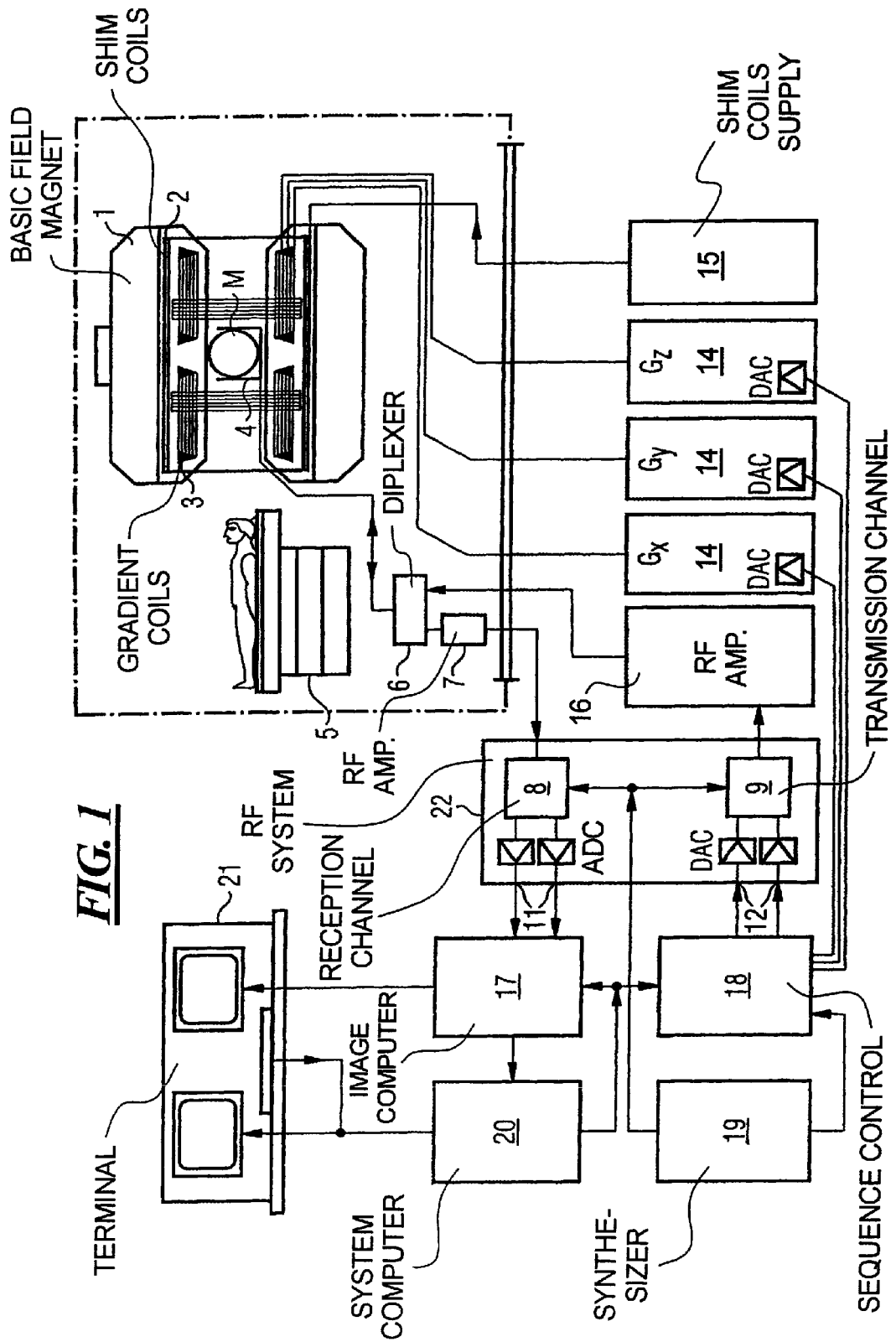
FIG. 1 schematically illustrates a magnetic resonance tomography apparatus operable in accordance with the invention.

FIG. 1 schematically shows a magnetic resonance imaging (magnetic resonance tomography) apparatus for generation of a magnetic resonance tomography image of a subject according to the present invention. The design of the magnetic resonance tomography apparatus thereby corresponds to the design of a conventional tomography apparatus, with the differences described below. A basic field magnet 1 generates a temporally-constant strong magnetic field for polarization or, respectively, alignment of the spins in the examination region of a subject such as, for example, of a part of a human body to be examined. The high homogeneity of the basic magnetic field necessary for the magnetic resonance measurement is defined in a spherical measurement volume M into which the parts of the human body to be examined are introduced. To support the homogeneity requirements, and in particular to eliminate temporally invariable influences, shim plates made from ferromagnetic material are mounted at a suitable location. Temporally-variable influences are eliminated by shim coils 2 that are activated by a shim power supply 15.

A cylindrical gradient coil system 3 that has three sub-windings is used in the basic field magnet 1. Each sub-winding is supplied with current from an amplifier 14 for generation of a linear gradient field in the respective direction of the Cartesian coordinate system. The first sub-winding of the gradient field system 3 thereby generates a gradient $G_x$ in the x-direction, the second sub-winding generates a gradient $G_y$ in the y-direction and the third sub-winding generates a gradient $G_z$ in the z-direction. Each amplifier 14 has a digital-analog converter that is activated by a sequence controller 18 for accurately timed generation of gradient pulses.

Located within the gradient field system 3 is a radio-frequency antenna 4 that converts the radio-frequency pulses emitted by a radio-frequency power amplifier 23 into an alternating electromagnetic field for excitation of the nuclei and alignment of the spins of the subject to be examined or, respectively, of the region of the subject to be examined. The radio-frequency antenna 4 has one or more RF transmission coils and a number of RF reception coils in the form of an advantageously linear arrangement of component coils. The alternating field originating from the precessing spins (i.e. normally the spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which are generated the radio-frequency pulses for the excitation of the magnetic resonance. The respective radio-frequency pulses are digitally represented in the sequence controller 18 as a series of complex numbers based on a pulse sequence predetermined by the system computer 20. This number series is respectively supplied as a real part and an imaginary part via an input 12 to a digital-analog converter in the radio-frequency system 22 and from this to a transmission channel 9. In the transmission channel 9 the pulse sequences are modulated on a radio-frequency carrier signal whose basic frequency corresponds to the resonance frequency of the spins in the measurement volume.

The switch-over from transmission to reception operation ensues with a transmission-reception diplexer 6. The RF transmission coil of the radio-frequency antenna 4 radiates the radio-frequency pulses for excitation of the spins into the measurement volume M for excitation of the spins and samples resulting echo signals via the RF acquisition coils. The correspondingly-acquired magnetic resonance signals are phase-sensitively demodulated in the acquisition channel 8 of the radio-frequency system 22 and converted into a real part and an imaginary part of the measurement signal by respective analog-digital converters. An image is reconstructed by an image computer 17 from the measurement data so acquired. The administration of the measurement data, the image data and the control programs ensues via the system computer 20. Based on a requirement with control programs, the sequence controller 18 monitors the generation of the respective desired pulse sequences and the corresponding sampling of k-space. The sequence controller 18 in particular controls the accurately timed switching of the gradients, the emission of the radio-frequency pulses with defined phase and amplitude and the acquisition of the magnetic resonance signals. The time base (clock) for the radio-frequency system 22 and the sequence controller 18 is provided by a synthesizer 19. The selection of corresponding control programs for generation of a magnetic resonance image as well as the representation of the generated magnetic resonance image ensues at a terminal 21 that has a keyboard as well as one or more display screens.

As in the prior art, an input of the measurement parameters by the user (in general the physician) initially also ensues in the framework of the present inventive method, and in fact via a user interface that is typically presented in the form of an input window (pop-up window) on the screen of the terminal 21. The measurement system of the magnetic resonance tomography apparatus is configured on the basis of the input parameters such that the apparatus is able to generate a fast spiral scanning sequence in the transmission channel 9 via the system computer 20 and the sequence controller 19. Such a conventional sequence would sample a matrix in a spiral shape in k-space according to FIG. 2, with the sampling ensuing on the basis of one or more spiral trajectories that are interwoven or offset relative to one another (for example, in FIG. 2 two spiral trajectories are shown in the form of a dashed spiral line and a solid spiral line).

Figure 2:
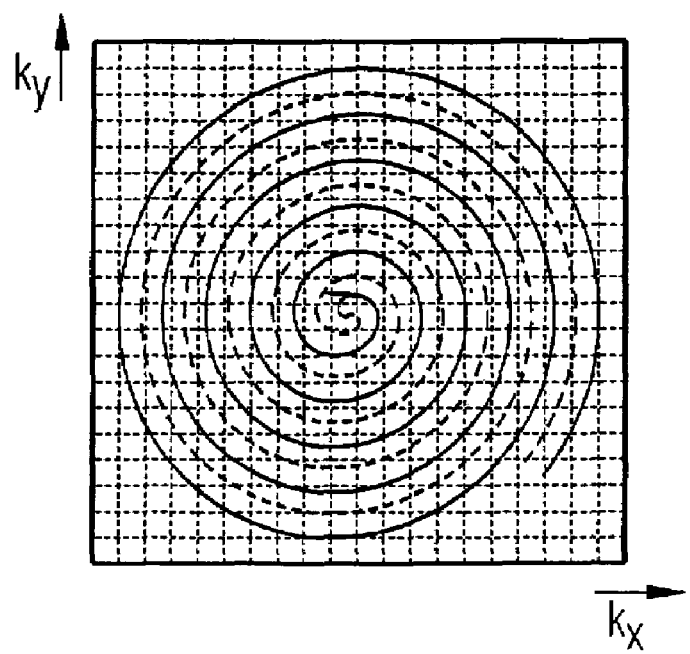
FIG. 2 schematically shows two k-space trajectories interwoven with one another with conventional spiral coding according to the prior art.
Figure 3:
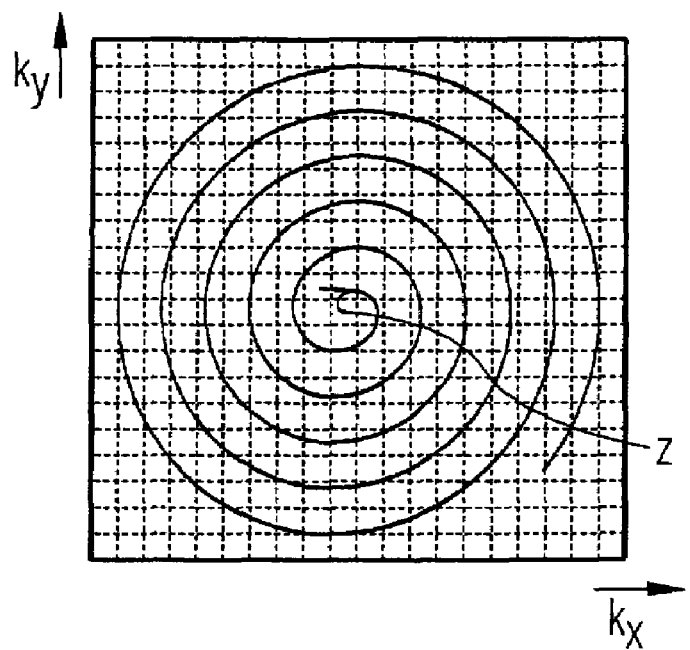
FIG. 3 schematically shows an under-sampled k-space trajectory with inventive spiral coding.
Figure 5:
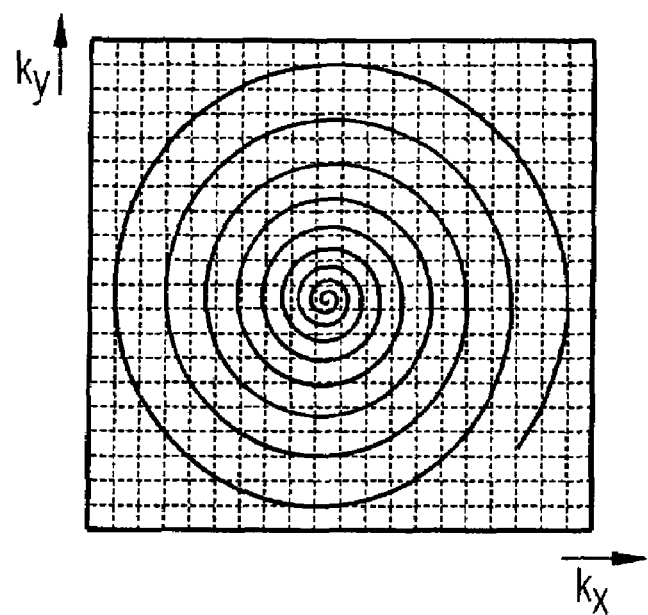
FIG. 5 schematically shows an under-sampled k-space trajectory with full or over-sampling in the region of the center of the k-matrix.

In order to transform the k-space data into an MRT image via a Fourier transformation, the entire spiral data set must be projected onto a Cartesian grid (such a grid is shown in the background in FIGS. 2, 3 and 5). The grid constant of the grid raster is thereby determined via the distance of the spiral lines from one another as well as the size of k-space. The values of the grid intersection points are interpolated via an approximation method (interpolation method) based on the nearest points in the spiral data set.

The reconstruction by means of Fourier transformation in three-dimensional space would in fact yield an anatomical image which, however, exhibits the aforementioned "blurring" typical given spiral coding.

In order to suppress the "blurring", in accordance with the invention a spiral sequence (either via a further user input or automatically) is modified such that only a reduced portion of the k-matrix underlying the output sequence is sampled or passed through in a spiral form—which can in this context be called "under-sampling". Such a reduced spiral sampling is shown in FIG. 3. The reduction ensues inventively by the distance of the spiral lines from one another being, for example, widened, or one or more spirals being omitted. For example, in FIG. 3 only the solid spiral from FIG. 2 is shown; the dashed spiral from FIG. 2 was omitted. For example, the sampling duration is shortened by a factor of approximately 2 in this manner.

Figure 4:
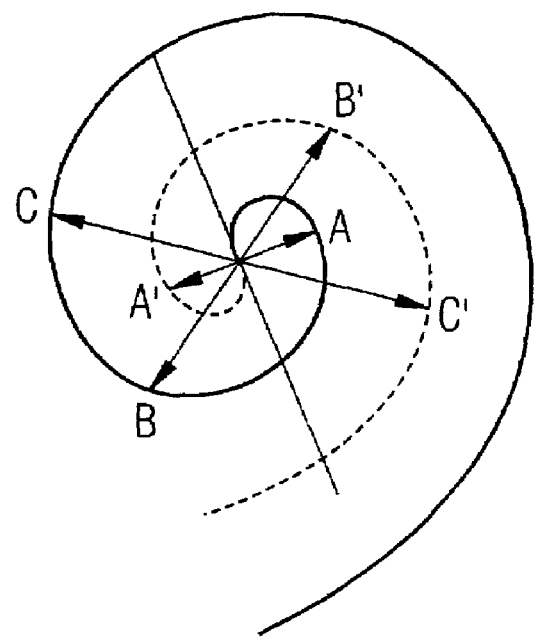
FIG. 4 schematically shows the acquisition of an under-sampled second k-space trajectory from an under-sampled first k-space trajectory via point mirroring in accordance with the invention.

The present invention utilizes the fact that the sampling method in a spiral coding is similar to that of a radially-symmetrical sampling. The inventive principle is based on the fact that points mirrored symmetrical to the k-space center possess identical information, meaning that points mirrored on the center Z of the k-matrix are complexly conjugated relative to one another. For example, if one considers a spiral sampling with two interleaved spiral trajectories (Engl.: 2-interleave spiral experiment), the measurement values of the one spiral (of the one spiral arm) can thus be attained purely by calculation via complex conjugation. In other words: the corresponding image can be completely reconstructed solely from the data of the first spiral arm or even from the data of the second spiral arm. In FIG. 4 the reconstruction method is illustrated using four points A, B, C and D. The points are mirrored on the center Z and mapped to the points A', B', C' and D'. The mirroring or mapping of all points of the solid spiral trajectory ultimately supplies a second spiral trajectory (drawn dashed) via which a complete data set is obtained in combination with the first spiral trajectory.

However, with spiral samplings in reality phase variations generally occur over the entire k-matrix, which phase variations are mathematically articulated in a deviation from the complexly-conjugated behavior and lead to further artifacts across the entire reconstructed image. This problem can be inventively remedied in that, given the inventive spiral-shaped under-sampling, the under-sampling ceases in the region of the center of the k-matrix and a complete sampling (if not even an over-sampling) ensues. Such an "inhomogeneous" spiral (variable density spiral) is shown in FIG. 5. A variable-density spiral trajectory enables known phase correction methods such as, for example, the Margosian or Pocs algorithms used in the partial Fourier technique using a low-resolution image. Such a variable-density spiral trajectory typically, advantageously causes only an insignificantly longer readout time and can therefore be implemented without problems.

In summary, the inventive method achieves shortening the readout train and therewith distinctly improving the image quality in the spiral sampling. The inventive method simultaneously achieves a significant increase of the temporal resolution. The inventive method places no increased demands on the hardware. The increase in computational effort and the increase in the computing power associated with this is insignificant.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for spiral-shaped k-space sampling in magnetic resonance tomography, comprising the steps of:
   in a computer, producing a k-space matrix to be filled with raw magnetic resonance data;
   undersampling said k-space matrix by entering said raw magnetic resonance data into said k-space matrix by spiral-shaped k-space sampling according to a spiral trajectory comprising a first spiral, and
   with no entry of additional raw magnetic resonance data into said k-space matrix, generating a second spiral, by point mirroring of the raw magnetic resonance data previously entered into said k-space matrix at a center of the k-space matrix, said second spiral forming a complete data set of said k-space matrix together with said first spiral; and
   executing said sampling at said center of said k-space matrix with a density selected from the group consisting of full density and excessive density.

2. A method as claimed in claim 1 comprising phase-correcting said raw magnetic resonance data entered into said k-space matrix with an algorithm selected from the group consisting of Margosian algorithms and Pocs algorithms.

3. A magnetic resonance tomography apparatus comprising:
   a magnetic resonance scanner configured to interact with a subject in order to obtain raw magnetic resonance data therefrom;
   a computer that controls operation of said magnetic resonance scanner;
   said computer filling a k-space matrix with said raw magnetic resonance data by undersampling said k-space matrix by entering said raw magnetic resonance data into said k-space matrix by spiral-shaped k-space sampling according to a spiral trajectory comprising a first spiral, and
   by generating a second spiral with no entry of additional raw magnetic resonance data into said k-space matrix, by point mirroring of the raw magnetic resonance data previously entered into said k-space matrix at a center of the k-space matrix, said second spiral forming a complete data set of said k-space matrix together with said first spiral; and
   executing said sampling at said center of said k-space matrix with a density selected from the group consisting of full density and excessive density.

4. A computer-readable medium encoded with a data structure, configured for use with a magnetic resonance tomography apparatus having a magnetic resonance scanner configured to interact with a subject in order to obtain raw magnetic resonance data therefrom, and a computer that controls operation of said magnetic resonance scanner, said data structure when said medium is loaded into said computer causing said computer to:
   produce a k-space matrix filled with magnetic resonance data by undersampling said k-space matrix by entering said raw magnetic resonance data into said k-space matrix by spiral-shaped k-space sampling according to a spiral trajectory comprising a first spiral;

generate a second spiral, with no entry of additional raw magnetic resonance data into said k-space matrix by point mirroring of the raw magnetic resonance data previously entered into said k-space matrix at a center of the k-space matrix, said second spiral forming a complete data set of said k-space matrix together with said first spiral; and execute said sampling at said center of said k-space matrix with a density selected from the group consisting of full density and excessive density.

* * * * *